(12) United States Patent
Klippel (10) Patent No.: US 8,078,433 B2
(45) Date of Patent: Dec. 13, 2011

(54) OPTIMAL ESTIMATION OF TRANSDUCER PARAMETERS

(76) Inventor: Wolfgang Klippel, Dresden (DE)

( * ) Notice: Subject to any disclaimer, the term of this patent is extended or adjusted under 35 U.S.C. 154(b) by 879 days.

(21) Appl. No.: 12/009,879

(22) Filed: Jan. 22, 2008

(65) Prior Publication Data

US 2008/0189087 A1 Aug. 7, 2008

(30) Foreign Application Priority Data

Feb. 1, 2007 (DE) .................. 10 2007 005 070

(51) Int. Cl.
*G06F 7/60* (2006.01)
*G06F 17/10* (2006.01)

(52) U.S. Cl. ............................ 703/2; 327/560
(58) Field of Classification Search ....... 703/2; 327/560
See application file for complete search history.

(56) References Cited

U.S. PATENT DOCUMENTS

| | | | |
|---|---|---|---|
| 4,196,418 A | 4/1980 | Kip et al. | 340/152 T |
| 4,291,277 A | 9/1981 | Davis et al. | 330/149 |
| 4,862,160 A | 8/1989 | Ekchian et al. | 340/825.54 |
| 5,266,875 A | 11/1993 | Slotine et al. | 318/568.11 |
| 5,268,834 A | 12/1993 | Sanner et al. | 364/151 |
| 5,438,625 A | 8/1995 | Klippel | 381/96 |
| 5,523,715 A | 6/1996 | Schrader | 330/10 |
| 5,539,482 A | 7/1996 | James et al. | 351/246 |
| 6,167,360 A * | 12/2000 | Erickson et al. | 703/6 |
| 6,269,318 B1 | 7/2001 | Geddes | 702/109 |
| 6,611,823 B1 | 8/2003 | Selmic et al. | 706/14 |
| 2003/0118193 A1 | 6/2003 | Leske et al. | |

FOREIGN PATENT DOCUMENTS

| | | |
|---|---|---|
| DE | 4332804 A1 | 3/1995 |
| DE | 4334040 A1 | 4/1995 |
| EP | 1423664 A0 | 6/2004 |
| EP | 1466289 | 10/2004 |
| WO | WO 9725833 | 7/1997 |
| WO | WO 0202974 A2 | 10/2002 |
| WO | WO 02095650 A2 | 11/2002 |

OTHER PUBLICATIONS

V.J. Mathews, Adaptive Polynomial Filters, IEEE SP Magazine, Jul. 1991, pp. 10-26.

(Continued)

*Primary Examiner* — Saif Alhija
(74) *Attorney, Agent, or Firm* — Koppel, Patrick, Heybl & Philpott (57) ABSTRACT

The invention relates to an arrangement and method for estimating the linear and nonlinear parameters of a model 11 describing a transducer 1 which converts input signals x(t) into output signals y(t) (e.g., electrical, mechanical or acoustical signals). Transducers of this kind are primarily actuators (loudspeakers) and sensors (microphones), but also electrical systems for storing, transmitting and converting signals. The model describes the internal states of the transducer and the transfer behavior between input and output both in the small- and large-signal domain. This information is the basis for measurement applications, quality assessment, failure diagnostics and for controlling the transducer actively. The identification of linear and nonlinear parameters $P_l$ and $P_n$ of the model without systematic error (bias) is the objective of the current invention. This is achieved by using a transformation system 55 to estimate the linear parameters $P_l$ and the nonlinear parameters $P_n$ with separate cost functions.

18 Claims, 6 Drawing Sheets

OTHER PUBLICATIONS

J. Suykens, et al., "Feedback linearization of Nonlinear Distortion in Electro-dynamic Loudspeakers," J. Audio Eng. Soc., 43, pp. 690-694.

W. Klippel, "The Mirror Filter—a New Basis for Reducing Nonlinear Distortion Reduction and Equalizing Response in Woofer Systems", J. Audio Eng. Society 32 (1992), pp. 675-691.

W. Klippel, "Adaptive Nonlinear Control of Loudspeaker Systems," J. Audio Eng. Society 46, pp. 939-954 (1998).

"Average of the Product of Gaussian Variables," in M. Schertzen, "The Volterra and Wiener Theories of Nonlinear Systems", Robert E. Krieger Publishing Company, Malabar, Florida, (1989.), pp. 510-514.

Regaila, Phillip A., "Adaptive IIR Filtering in Signal Processing and Control", p. 229, (1994).

Regalia, Phillip A., "Stable and Efficient Lattice Algorithms for Adaptive IIR Filtering", IEEE Transactions on Signal Processing, vol. 40, No 2, p. 380, (Feb. 1992).

* cited by examiner

OPTIMAL ESTIMATION OF TRANSDUCER PARAMETERS

BACKGROUND OF THE INVENTION

1. Field of the Invention

The invention relates generally to an arrangement and a method for estimating the linear and nonlinear parameters of a model describing a transducer which converts input signals (e.g., electrical, mechanical or acoustical signals) into output signals (e.g., electrical, mechanical or acoustical signals). Transducers of this kind are primarily actuators (such as loudspeakers) and sensors (such as microphones), but also electrical systems for storing, transmitting and converting signals. The model is nonlinear and describes the internal states of the transducer and the transfer behavior between input and output at small and high amplitudes. The model has free parameters which have to be identified for the particular transducer at high precision while avoiding any systematic error (bias). The identification of nonlinear systems is the basis for measurement applications, quality assessment and failure diagnostics and for controlling the transducer actively.

2. Description of the Related Art

Most of the nonlinear system identification techniques known in prior art are based on generic structures such as polynomial filters using the Volterra-Wiener-series as described by V. J. Mathews, Adaptive Polynomial Filters, IEEE SP MAGAZINE, Jul. 1991, pages 10-26. Those methods use structures with sufficient complexity and a large number of free parameters to model the real system with sufficient accuracy. This approach is not applicable to an electro-acoustical transducer as the computational load can not be processed by available digital signal processors (DSPs). However, by exploiting a priori information on physical relationships it is possible to develop special models dedicated to a particular transducer as disclosed in U.S. Pat. No. 5,438,625 and by J. Suykens, et al., "Feedback linearization of Nonlinear Distortion in Electro-dynamic Loudspeakers," J. Audio Eng. Soc., 43, pp 690-694). Those models have a relatively low complexity and use a minimal number of states (displacement, current, voltage, etc.) and free parameters (mass, stiffness, resistance, inductance, etc.). Static and dynamic methods have been developed for measuring the parameters of those transducer-oriented models. The technique disclosed by W. Klippel, "The Mirror Filter—a New Basis for Reducing Nonlinear Distortion Reduction and Equalizing Response in Woofer Systems", J. Audio Eng. Society 32 (1992), pp. 675-691, is based on a traditional method for measuring nonlinear distortion. The excitation signal is a two-tone signal generating sparse distortion components which can be identified as harmonic, summed-tone or difference tone components of a certain order. This method is time consuming and can not be extended to a multi-tone stimulus because the distortion components interfere if the number of fundamental tones is high. In order to estimate the nonlinear parameters with an audio-like signal (e.g., music), adaptive methods have been disclosed in DE 4332804A1 or W. Klippel, "Adaptive Nonlinear Control of Loudspeaker Systems," J Audio Eng. Society 46, pp. 939-954 (1998).

Patents DE 4334040, WO 97/25833, US 2003/0118193, U.S. Pat. Nos. 6,269,318 and 5,523,715 disclose control systems based on the measurement of current and voltage at the loudspeaker terminals while dispensing with an additional acoustical or mechanical sensor.

Other identification methods, such as those disclosed in U.S. Pat. Nos. 4,196,418, 4,862,160, 5,539,482, EP1466289, U.S. Pat. Nos. 5,268,834, 5,266,875, 4,291,277, EP1423664, U.S. Pat. No. 6,611,823, WO 02/02974, WO 02/095650, provide only optimal estimates for the model parameters if the model describes the behavior of the transducer completely. However, there are always differences between the theoretical model and the real transducer which causes significant errors in the estimated nonlinear parameters (bias). This shall be described in the following section in greater detail:

The output signal y(t) of the transducer:

$$y(t)=y_{nlin}(t)+y_{lin}(t) \qquad (1)$$

consists of a nonlinear signal part:

$$y_{nlin}(t)=P_{sn}G_n(t) \qquad (2)$$

and a linear signal part:

$$y_{lin}(t)=P_{sl}G_l(t)+e_r(t). \qquad (3)$$

The linear signal part $y_{lin}(t)$ comprises a scalar product $P_{sl}G_l(t)$ of a linear parameter vector $P_{sl}$, a gradient vector $G_l(t)$ and a residual signal $e_r(t)$ due to measurement noise and imperfections of the model.

The nonlinear signal part $y_{nlin}(t)$ can be interpreted as nonlinear distortion and can be described as a scalar product of the parameter vector:

$$P_{sn}=[p_{s,1}\,p_{s,2}\ldots p_{s,N}] \qquad (4)$$

and the gradient vector:

$$G_n^T(t)=[g_1(t)g_2(t)\ldots g_N(t)] \qquad (5)$$

which may contain, for example:

$$G_n^T(t)=[i(t)x(t)^2 i(t)x(t)^4 i(t)x^6] \qquad (6)$$

products of input signal x(t) and the input current:

$$i(t)=h_i(t)*x(t). \qquad (7)$$

The model generates an output signal:

$$y'(t)=P_n G_n(t)+P_l G_l(t), \qquad (8)$$

which comprises scalar products of the nonlinear parameter vector:

$$P_n=[P_{n,1}\,P_{n,2}\ldots P_{n,N}] \qquad (9)$$

and the linear parameter vector:

$$P_l=[P_{l,1}\,P_{l,2}\ldots P_{l,L}] \qquad (10)$$

with the corresponding linear and nonlinear gradient vector $G_n(t)$ and $G_l(t)$, respectively. It is the target of the optimal system identification that the parameters of the model coincide with the true parameters of the transducer ($P_n \to P_{s,n}$, $P_l \to P_{s,l}$).

A suitable criterion for the agreement between model and reality is the error time signal:

$$e(t)=y(t)-y'(t), \qquad (11)$$

which can be represented as a sum:

$$e(t)=e_n(t)+e_l(t)+e_r(t) \qquad (12)$$

comprising a nonlinear error part:

$$e_n(t)=\Delta P_n G_n=(P_{sn}-P_n)G_n, \qquad (13)$$

a linear error part:

$$e_l(t)=\Delta P_l G_l(P_{sl}-P_l)G_l \qquad (14)$$

and the residual signal $e_r(t)$.

System identification techniques known in the prior art determine the linear and nonlinear parameters of the model by minimizing the total error e(t) in a cost function:

$$C=E\{e(t)^2\}\to \text{Minimum}. \qquad (15)$$

The linear parameters $P_l$ are estimated by inserting Eqs. (1) and (8) into Eq. (11), multiplying with the transposed gradient vector $G_l^T(t)$ and calculating the expectation value $$E\{f\} = \lim_{T\to\infty}\left(\frac{1}{T}\int_0^T f(t)\right). \tag{16}$$

Considering that the residual error $e_r(t)$ is not correlated with the linear gradient signals in $G_l(t)$, this results in the Wiener-Hopf-equation:

$$P_l E\{G_l(t)G_l^T(t)\} = E\{y_{lin}(t)G_l^T(t)\} - E\{e_n(t)G_l^T(t)\}$$
$$P_l S_{GGl} = S_{yGl} + S_{rGl} \tag{17}$$

which can be solved directly by multiplying this equation with the inverted matrix $S_{GGl}$:

$$P_l = (S_{yGl} + S_{rGl})S_{GGl}^{-1}P_l = P_{sl} + \Delta P_l \tag{18}$$

or determined iteratively by using the LMS algorithm:

$$P_l^T(t) = P_l^T(t-1) + \mu G_l(t)e(t) \tag{19}$$
$$= P_l^T(t-1) + \mu G_l(t)e_l(t) + \mu G_l(t)e_n(t) \to$$
$$P_{sl}^T + \Delta P_l^T$$

with parameter $\mu$ changing the speed of convergence. The linear parameters $P_l$ are estimated with a systematic bias $\Delta P_l$ if there is a correlation between the nonlinear error $e_n(t)$ and the linear gradient vector $G_l(t)$.

Minimizing the total error in the cost function in Eq. (15) may also cause a systematic bias in the estimation of the nonlinear parameters $P_n$. Inserting Eq. (1) and (8) into Eq. (11) and multiplying with the transposed gradient vector $G_n^T(t)$ results in the Wiener-Hopf-equation for the nonlinear parameters:

$$P_n E\{G_n(t)G_n^T(t)\} = E\{y_{nlin}(t)G_n^T(t)\} - E\{[e_l(t)+e_r(t)]$$
$$G_n^T(t)\} P_n S_{GGn} = S_{yGn} = S_{yGn} + S_{rGn} \tag{20}$$

where $S_{GGn}$ is the autocorrelation of the gradient signals, $S_{yGn}$ is the cross-correlation between the gradients and the signal $y_{nlin}(t)$ and $S_{rgn}$ is the cross-correlation of the residual error $e_r$ with the gradient signals. The nonlinear parameters of the model can directly be calculated by inverting the matrix $S_{GGn}$:

$$P_n = (S_{yGn} + S_{rGn})S_{GGn}^{-1}P_n = P_{sn} + \Delta P_n \tag{21}$$

or iteratively by using the LMS-algorithm:

$$P_n^T(t) = P_n^T(t-1) + \mu G_n(t)e(t) \tag{22}$$
$$= P_n^T(t-1) + \mu G_n(t)e_n(t) + \mu G_n(t)[e_l(t) + e_r(t)] \to$$
$$P_{sn}^T + \Delta P_n^T.$$

These techniques known in prior art generate a systematic deviation $\Delta P_n$ from the true parameter values if either the linear error $e_l$ or the residual error $e_r$ correlates with the nonlinear gradient $G_n$:

$$E\{G_n(t)[e_l(t)+e_r(t)]\} \ne 0 \tag{23}$$

The bias $\Delta P_n$ in the estimation of $P_n$ is significant (>50%) if the nonlinear distortion $y_{nlin}$ is small in comparison to the residual signal $e_r(t)$, which is mainly caused by imperfections in the linear modeling.

To cope with this problem, the prior art increases the complexity of the linear model (e.g. the number of taps in an FIR-filter) to describe the real impulse response $h_m(t)$ more completely. This demand can not be realized in many practical applications. For example, the suspension in a loudspeaker has a visco-elastic behavior which can hardly be modeled by a linear filter of reasonable order. The eddy currents induced in the pole plate of a loudspeaker also generate a high complexity of the electrical input impedance. In addition, loudspeakers also behave as time varying systems where aging and changing ambient conditions (temperature, humidity) cause a mismatch between reality and model which increases the residual error signal $e_r(t)$.

OBJECTS OF THE INVENTION

There is thus a need for an identification system which estimates the nonlinear parameters $P_n$ and the linear parameters $P_l$ of the model without a systematic error (bias) if the measured signals are disturbed by noise or there are imperfections in the modeling of the transducer. The free parameters of the model should be identified by exciting the transducer with a normal audio signal (e.g. music), a synthetic test signal (e.g. noise) or a control signal as used in active noise cancellation having sufficient amplitude and bandwidth to provide persistent excitation. The transferred signal shall not or only minimally be changed by the identification system to avoid any degradation of the subjectively perceived sound quality. A further object is to realize an identification system for transducers comprising a minimum of elements and requiring minimal processing capacity in a digital signal processor (DSP) to keep the cost of the system low.

SUMMARY OF THE INVENTION

According to the invention, the nonlinear parameters $P_n$ are estimated by minimizing the cost function:

$$C_n = E\{e_n(t)^2\} \to \text{Minimum} \tag{24}$$

which considers the nonlinear error part $e_n$ only. In this case, the correlation:

$$E\{G_n(t)e_n(t)\} = 0 \tag{25}$$

between nonlinear error part $e_n(t)$ and nonlinear gradient signal $G_n(t)$ vanishes. Thus, a systematic error (bias) in the estimated value of the nonlinear parameter $P_n$ can be avoided.

The nonlinear cost function $C_n$ is not suitable for an error-free estimation of the linear parameters $P_l$. Using different cost functions for the estimation of the linear and nonlinear parameters is a feature of the current invention not found in prior art. This requirement can be realized theoretically by splitting the total error $e(t)$ into error components according to Eq. (12) and using only the nonlinear error part $e_n(t)$ for the estimation of the nonlinear parameters $P_n$. However, the practical realization is difficult and it is more advantageous to apply an appropriate transformation $T_g$ to the gradient signal $G_n(t)$ and to generate a modified gradient signal:

$$G'^T(t) = [g_1'(t) \quad g_2'(t) \quad \cdots \quad g_N'(t)] \tag{26}$$
$$= T_g\{G_n^T(t)\}$$

and/or to transform the error signal $e(t)$ by an appropriate transformation $T_e$ into a modified error signal:

$$e_j'(t) = T_{e,j}\{e(t)\} = e'_{n,j}(t) + e'_{res,j}(t), j=1,\ldots,N. \tag{27}$$

The transformations $T_g$ and $T_e$ have to be chosen to ensure that the correlation:

$$E\{g'_j(t)e'_{res,j}(t)\}=0, j=1,\ldots,N \quad (28)$$

between the transformed residual error $e'_{res,j}(t)$ and the transformed gradient signals $g'_j(t)$ will vanish, and a positive correlation:

$$E\{g_j(t)g'_j(t)^T\}>0, j=1,\ldots,N \quad (29)$$

between original and transformed gradient signals and a positive correlation:

$$E\{e_n(t)e'_{n,j}(t)\}>0, j=1,\ldots,N \quad (30)$$

between the original and transformed error is maintained.

The transformations $T_g$ and $T_e$ suppress the linear signal parts $y_{nlin}$ primarily, but preserve most of the information of the nonlinear signal part $y_{nlin}$ required for the estimation of the nonlinear parameters.

Using the transformed gradient signal g'(t) and the transformed error signal e'(t) in the LMS algorithm:

$$P_{n,j}(t)=p_{n,j}(t-1)+\mu g'_j(t)e'_j(t), j=1,\ldots,N P_n \rightarrow P_{sn} \quad (31)$$

results in an error-free estimation of the nonlinear parameters ($P_n=P_{sn}$). Suitable transformations can be realized by different methods:

The first method developed here is a new decorrelation technique which has the benefit that a modification of the input signal x(t) is not required. A signal with arbitrary temporal and spectral properties ensuring persistent excitation of the transducer is supplied to the transducer input 7. Although the decorrelation technique can be applied to the output signal y(t), it is beneficial to calculate the decorrelated error signal:

$$e'_j(t)=T_{e,j}\{e(t)\}=e(t)+C_jB_j, j=1,\ldots,N \quad (32)$$

which is the sum of the original error signal and the jth compensation vector:

$$B_j^T=[b_{j,1} b_{j,k}\ldots b_{j,K}], \quad (33)$$

weighted by the jth decorrelation parameter vector:

$$C_j=[c_{j,1} c_{j,k}\ldots c_{j,K}]. \quad (34)$$

All compensation vectors $B_j$ with $j=1,\ldots,N$ comprise only decorrelation signals $b_{j,i}$ with $i=1,\ldots,K$, which have a linear relationship with the input signal x(t). Those decorrelation signals $b_{j,i}$ have to be derived from the transducer model and correspond with the gradient signals $g'_j$. The expectation value:

$$E\{e'_j g_j\}=\Sigma \Pi E\{\eta_k \eta_l\} \quad (35)$$

which is the product of the error signal $e'_j$ and the gradient signal $g_j$ can be decomposed into a sum of products in which each product comprises only expectation values of two basic signals $\eta_k$ and $\eta_l$ (as described, for example, in "Average of the Product of Gaussian Variables," in M. Schertzen, "The Volterra and Wiener Theories of Nonlinear Systems", Robert E. Krieger Publishing Company, Malabar, Fla., 1989.)

Applying Eq. (35) to the first gradient signal $g_l(t)=ix^2$ presented as an example in Eq. (6) results in:

$$E\{ix^2 e'_l(t)\}=2E\{ix\}E\{xe_l(t)\}+E\{ie_l(t)\}E\{x^2\}. \quad (36)$$

The correlation between the nonlinear gradient signal $ix^2$ and an arbitrary (linear) error part $e'_{res,l}(t)$ in $e'_l(t)$ vanishes if the following conditions:

$$E\{xe_l(t)\}=0 E\{ie_l(t)\}=0 \quad (37)$$

hold.

The transformation $T_{e,j}$ of the error signals e(t) has to remove the correlation between $e'_l(t)$ and x and the correlation between $e'_l(t)$ and i as well. The compensation vector:

$$B_l^T=[x\ i] \quad (38)$$

for j=1 comprises only displacement x(t) and current i(t) which are weighted by $C_j$ and added to the original error signal e(t) as decorrelation signals according to Eq. (32). The optimal decorrelation parameter $C_j$ can be determined adaptively by the following iterative relationship:

$$C_j^T(t)=C_j^T(t-1)+\mu B_j e'_j(t), j=1,\ldots,N. \quad (39)$$

Using the additive decorrelation method the transformed gradient signal $G'(t)=T_g\{G_n\}=G_n$ is equal to the gradient signal $G_n$. The nonlinear information in the error part $e_n$ which is required for the estimation of the nonlinear parameters $P_n$ is preserved in the transformed error signal $e'_j(t)$. If the error signal $e'_j(t)$ contains the nonlinear gradient signal $e'_{n,l}(t)=ix^2$, the expectation value:

$$E\{ix^2 ix^2\}=2E\{ii\}E\{xx\}^2+4E\{ix\}^2 E\{xx\}\neq 0, \quad (40)$$

will not vanish and the condition in Eq. (29) is fulfilled.

The transformed error signal $e'_l(t)$ can not be used for the estimation of the linear parameters $P_l$; the original error signal e(t) according to Eq. (19) should be used instead.

An alternative transformation which fulfills the requirements of Eqs. (28)-(30) can be realized by performing a filtering:

$$x(t)=h_g(t)*u(t) \quad (41)$$

of the excitation signal with the filter function:

$$H_g(f)=FT\{h_g(t)\}=\sum_{i=1}^{I}(1-\delta(f-f_i)) \quad (42)$$

where FT{ } is Fourier transformation and the function $\delta(f)$ is defined as:

$$\delta(f)=\begin{cases} 1, \text{ for } f=0 \\ 0, \text{ for } f \neq 0 \end{cases}. \quad (43)$$

A few selected spectral components at frequencies $f_i$ with $i=1,\ldots I$ do not pass the filter, but the remaining signal components are transferred without attenuation.

A second filter with a transfer function:

$$H_a(f)=FT\{h_a(t)\}=\sum_{i=1}^{I}\delta(f-f_i) \quad (44)$$

is used for the transformation $T_e$ of the error signal:

$$e'_j(t)=h_a(t)*e_j(t), j=1,\ldots,N. \quad (45)$$

Since the filter $H_a(f)$ lets pass only spectral components which are not in the input signal x(t), the transformed error signal $e'_j(t)$ will not be correlated with the linear error signal $e'_{res}(t)$ fulfilling the first condition in Eq. (28). However, the error signal $e'_j(t)$ contains sufficient nonlinear spectral components from $e_{n,j}$, to ensure a correlation between both error signals according to the second condition in Eq. (30).

The LMS algorithm applied to the filtered error signal:

$$p_{n,j}(t)=p_{n,j}(t-1)+\mu g_j(t)e'_j(t), j=1,\ldots,N P_n \rightarrow P_{sn} \quad (46)$$

results in an error-free estimation of the nonlinear parameters as long as measurement noise is not correlated with the gradient signal $G_n(t)$. If the error signal is filtered, the transformed gradient signal $G'(t)=T_g\{G_n\}=G_n$ is identical with original gradient signal.

A third alternative to realize the conditions in Eq. (28)-(30) is the filtering of the gradient signals:

$$G'(t)=h_a(t)*G_n(t) \quad (47)$$

by using the filter function $H_a(f)$ defined in Eq. (44) while filtering the input signal with the filter function $H_g(f)$ according Eq. (42).

This transformation ensures that the filtered gradient signal $g'_j(t)$ is neither correlated with the linear error $e_r(t)$ nor with the residual error eat):

$$\left.\begin{array}{l}E\{g'_j(t)e_r(t)\}=0\\ E\{g'_j(t)e_l(t)\}=0\end{array}\right\}, j=1,\ldots N. \quad (48)$$

Assuming that the measurement noise is not correlated with $g'_j(t)$, the nonlinear parameters:

$$p_{n,j}(t)=p_{n,j}(t-1)+\mu g'_j(t)e_j(t), j=1,\ldots,NP_n \rightarrow P_{sn} \quad (49)$$

can be estimated without bias using the LSM algorithm.

The total number of frequencies I and the values $f_i$ with i=1,..., I have to be selected in such a way to provide persistent excitation of the transducer and to get sufficient information from the nonlinear system. If the number I of frequencies is too large, the filtering of the input signal impairs the quality of transferred audio signal (music, speech).

The number I of the frequencies $f_i$ can be significantly reduced (e.g., I=1) if the values of the frequencies are not constant but rather vary with a function $f_i=f(t)$ of time. This extends the learning time, but causes only minimal changes in the transferred audio signal. When a relatively small number of frequencies I is used, it is not possible to identify the order and contribution of each distortion component. This is a difference with respect to traditional methods used in prior art for distortion measurements and nonlinear system identification.

If the nonlinear parameters $P_n$ have been estimated without bias and the nonlinear error $e_n(t)$ disappears, the linear parameters $P_l$ can be estimated without bias by minimizing the cost function C in Eq. (15).

The current invention has the benefit that the linear and nonlinear parameters can be determined without a systematic error (bias), even if the modeling of the linear properties of the transducer is not perfect. This reduces the effort in modeling complicated mechanisms (e.g., creep of the suspension) and makes it possible to use models with lower complexity and a minimal number of free parameters. This is beneficial for speeding up the identification process, improving the robustness and reducing implementation cost.

These and other features, aspects, and advantages of the present invention will become better understood with reference to the following drawings, description, and claims.

DETAILED DESCRIPTION OF THE INVENTION

Figure 1:
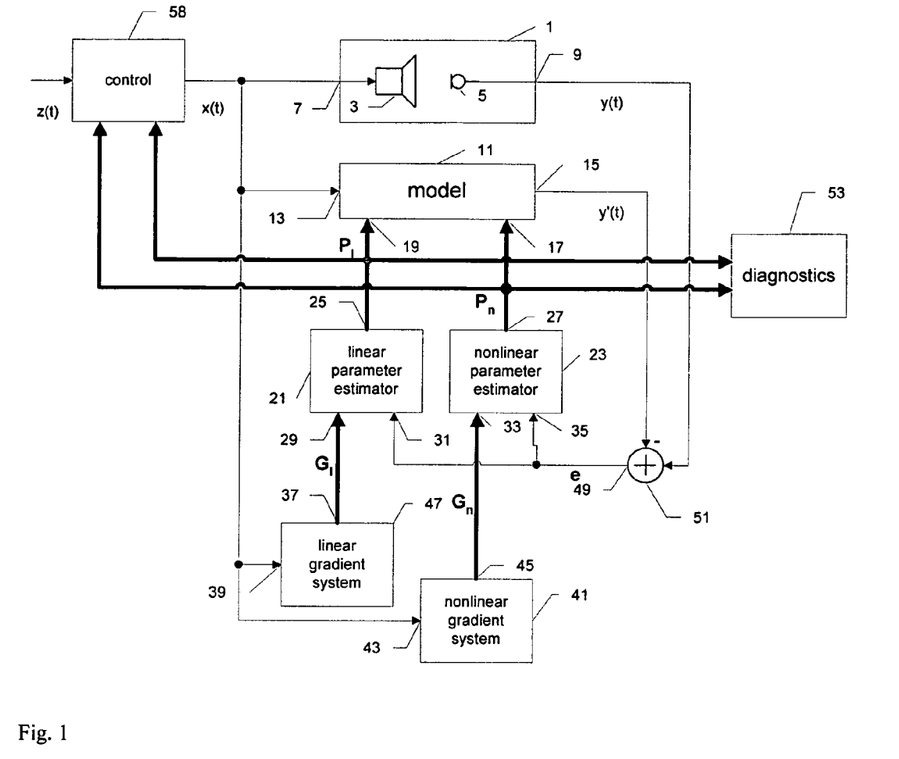
FIG. 1 is a general block diagram showing a parameter identification system for a measurement, diagnostics and control application known in the prior art.

FIG. 1 is a general block diagram showing a parameter identification system for measurement, diagnostics and control application in the prior art. The real transducer system 1 consists of a loudspeaker 3 (actuator) converting an electrical input signal x(t) (e.g., voltage at the terminals) at input 7 into a acoustical signal and a microphone 5 (sensor) converting an acoustical signal into an electrical signal y(t) at output 9 which is supplied to the non-inverting input of an amplifier 51. The transfer behavior of transducer system 1 is represented by Eq. (1). The input signal x(t) is also supplied via input 13 to a model 11. The model 11 describes the linear and nonlinear transfer behavior of transducer system 1 and generates an output signal y'(t) at output 15 which is supplied to the inverting input of the amplifier 51. The nonlinear Eq. (8) describes the transfer behavior of the model 11, whereas the product of the linear parameter $P_l$ and linear gradient vector $G_l(t)$ is realized by using an FIR-filter. The nonlinear term $P_n G_n(t)$ is realized by using linear filter, multiplier, adder and scaling elements according to Eqs. (6), (7) and (9). The error signal e(t) generated at output 49 of the amplifier 51 according Eq. (11) is supplied to input 35 of the nonlinear parameter estimator 23 and to input 31 of a linear parameter estimator 21. According to prior art designs, both parameter estimators 21 and 23 minimize the error signal e(t) using the same cost function given in Eq. (15). The linear parameter estimator 21 is provided with the gradient vector $G_l$ which is generated in a linear gradient system 47 by using delay units and supplied from output 37 to the input 29. Similarly the nonlinear gradient system 41 generates the nonlinear gradient vector $G_n$ according to Eq. (6) which is supplied via output 45 to the input 33 of the nonlinear parameter estimator 23. Both parameter estimators 21 and 23 use the LMS algorithm as described in Eqs. (19) and (22). Both the linear and the nonlinear gradient system 47 and 41 are supplied with the input signal x(t) via inputs 39 and 43, respectively. The linear parameter vector $P_n$ is generated at output 25 of the linear parameter estimator 21 and supplied to the input 19 of the model 11. The nonlinear parameter vector $P_n$ is generated at output 27 of the nonlinear parameter estimator 23 and is supplied via input 17 to the model 11. The linear and nonlinear parameter vectors $P_l$ and $P_a$ are also supplied to the diagnostic system 53 and to a controller 58, which is supplied with the control input z(t) and generates the input signal x(t) which is supplied to the transducer input 7. The controller 58 performs a protection and linearization function for the transducer system 1. If the model 11 describes the linear properties of the transducer system 1 incompletely, the minimization of the cost function in Eq. (15) causes a systematic error (bias) in the estimation of the nonlinear parameter $P_n$ as shown in Eqs. (21) and (22).

Figure 2:
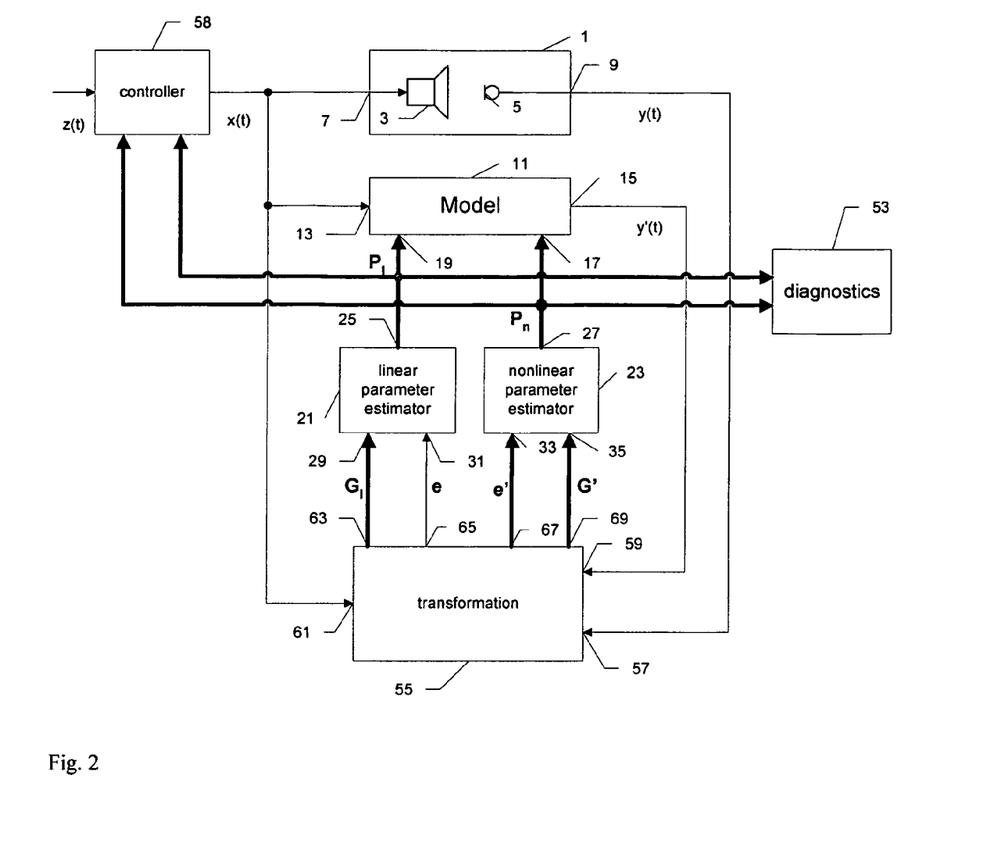
FIG. 2 is a general block diagram showing a parameter identification system for a measurement, diagnostics and control application in accordance with the present invention.

FIG. 2 is a block diagram showing a parameter identification system in accordance with the invention, which avoids the bias in the estimation of the nonlinear parameters. The transducer system 1 comprising loudspeaker 3 and microphone 5, model 11, the linear and nonlinear parameter estimators 21 and 23, respectively, the controller 58 and the diagnostic system 53 are identical with the corresponding elements shown in FIG. 1. The main difference to the prior art is that a transformation system 55 generates a modified error signal e'(t) and/or a modified nonlinear gradient signal G' which is supplied via outputs 67 and 69 to the inputs 33 and 35, respectively, of the nonlinear parameter estimator 23. The total error signal e(t) is transformed according $T_e$ in Eq. (27) into the modified error signal e'(t). The nonlinear gradient vector $G_n$ is transformed according to $T_g$ in Eq. (26) into the gradient vector G'. The special cost function $C_n$ in Eq. (24) is used for estimating the nonlinear parameters $P_n$ and the cost function C in Eq. (15) is used for the estimation of the linear parameters $P_l$. Using two different cost functions is a typical characteristic of the current invention. The transformation system 55 is supplied with the output signal y(t) from output 9 of the transducer system 1 via input 57 and with the output signal y'(t) from output 15 of the model 11 via input 59. The input signal x(t) from input 7 of the transducer system 1 is also supplied to the input 61 of the transformation system 55.

Figure 3:
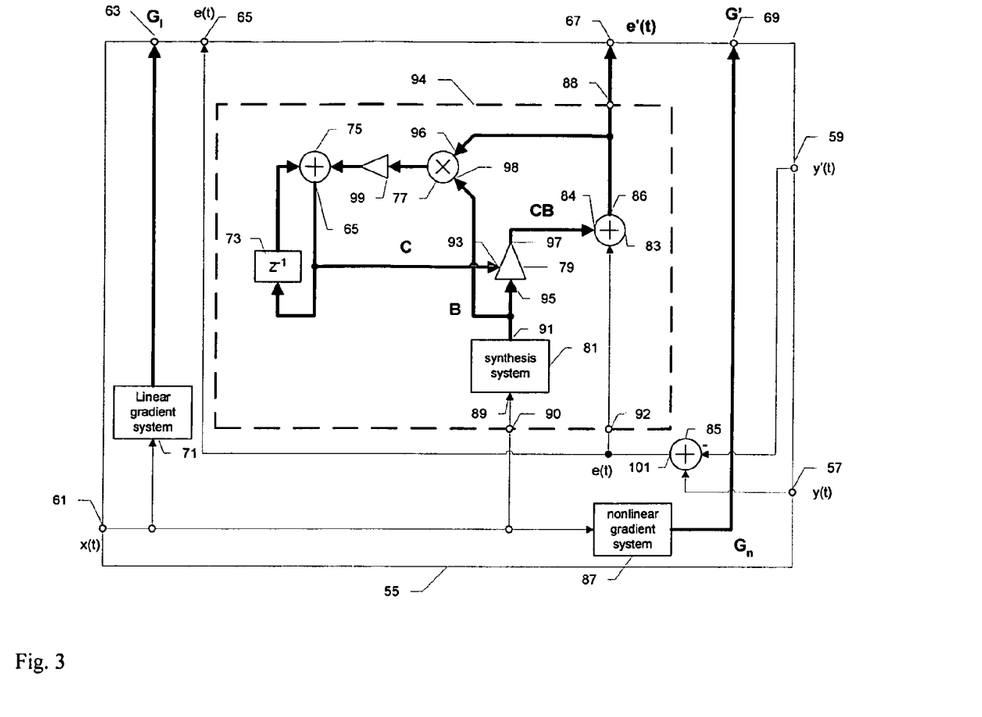
FIG. 3 shows a first embodiment of a transformation system using an additive decorrelation technique.

FIG. 3 shows a first embodiment of the transformation system 55 using an additive decorrelation technique. The transformation system 55 comprises a linear gradient system 71, a nonlinear gradient system 87, an amplifier 85 and a decorrelation system 94. The linear and nonlinear gradient systems 71 and 87 correspond with the gradient systems 47 and 41 in FIG. 1, respectively. The input signal x(t) at input 61 is supplied to both the input of the linear gradient system 71 and the input of the nonlinear gradient system 87. The output of the linear gradient system 71 is connected to an output 63 of the transformation system 55 at which the gradient vector $G_l(t)$ is generated. The gradient vector $G'(t)=G_n(t)$ at the output of the nonlinear gradient system 87 is supplied to an output 69 of the transformation system 55. The linear gradient system 71 can be realized as a FIR-filter and the nonlinear gradient system 87 can be realized by using linear filters, multipliers, adders and scaling elements according Eq. (6). The transformation system 55 also includes an amplifier 85 similar to the amplifier 51 in FIG. 1. The modeled output signal y'(t) and the measured signal y(t) at inputs 59 and 57 of the transformation system 55 are supplied to the inverting and non-inverting inputs of the amplifier 85, respectively. The error signal e(t) is generated at the output 101 of the amplifier 85 according to Eq. (11) and supplied to an output 65 of the transformation system 55 and to an error input 92 of the decorrelation system 94. The decorrelation system 94 comprises a synthesis system 81, weighting elements 79 and 99, adders 83 and 75, a multiplier 77 and a storage element 73. The error signal e(t) at input 92 is supplied to the scalar input of the adder 83. The adder 83 also has a vector input 84 provided with input signal $C_jB_j$ and a vector output 86 providing the output signal $e_j'(t)$ with j=1, . . . , N according Eq. (32) to an output 67 of the transformation system 55. The signals in the jth compensation vector $B_j$ with j=1, . . . , N are generated by using the synthesis system 81. The input 89 of synthesis system 81 is connected to input 61 of the transformation system 55. The synthesis system 81 contains linear filters which may be realized by digital signal processing. For each nonlinear gradient signal $g_j(t)$, a set of decorrelation signals $b_{j,i}$ in vector $B_j$ is found by splitting the expectation value $E\{g_j(t)e_j(t)\}$ according to Eq. (36) in a sum of products. The output 91 of the synthesis system 81 is connected to the input 95 of weighting element 79. The weighting element 79 also has a vector input 93 provided with the decorrelation parameters $C_j$ and an output 97 generating the weighted compensation signal $C_jB_j$ supplied to input 84 of the adder 83. The optimal decorrelation parameters $C_j$ are generated adaptively according to Eq. (37). The transformed error signal $e_j'(t)$ is supplied to a first input 96 of multiplier 77, and the compensation vector $B_j$ is supplied to the second (vector) input 98 of multiplier 77. The output signal $B_je_j'(t)$ of the multiplier 77 is supplied to an input of the weighting element 99 and is weighted by the learning constant μ. The output signal $\mu B_je_j'(t)$ is added to the decorrelation parameter vector $C_j$ stored in the storage element 73 by using adder 75, and the sum is supplied to a control input 93 of the weighting element 79.

Figure 4:
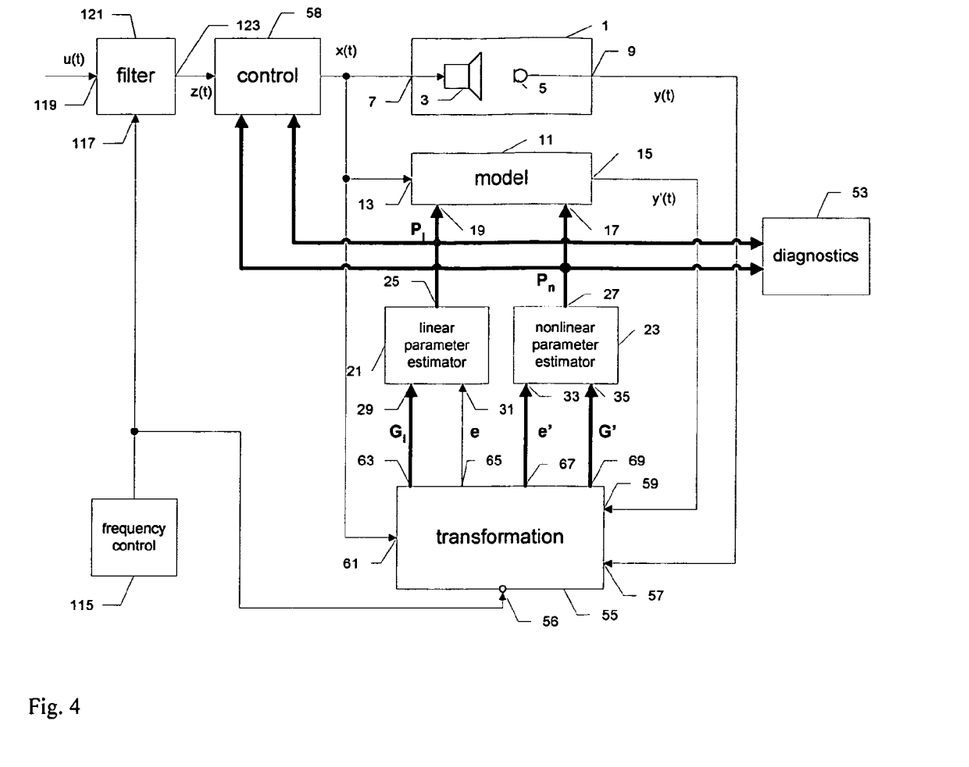
FIG. 4 shows an alternative embodiment of the present invention which uses a filter technique.

FIG. 4 shows a further embodiment of the invention using a filter 121 which changes the spectral properties of the signal supplied to the transducer system 1. The filter 121 has an input 119 supplied with the input signal u(t) and an output 123 connected via controller 58 to the input 7 of the transducer system 1. The filter 121 has a linear transfer function according to Eq. (42). A few spectral components at frequencies $f_i=1, \ldots$ I are suppressed while all the other components pass through filter 121 without attenuation. The filter 121 can be realized by using multiple filters with a band-stop characteristic which are connected in series between filter input 119 and filter output 123. Alternatively, the filter 121 may be realized in a DSP by performing a complex multiplication of the filter response $H_g(f)$ with the input signal transformed into the frequency domain. The filter 121 may be equipped with an additional control input 117 connected with the output of a frequency control system 115 to vary the frequencies $f_i$ during parameter identification. The frequency control system 115 can be realized as a simple oscillator generating a low frequency signal varying the frequency f, of the band-stop filter for I=1. The output of the frequency control system 115 is also supplied to a control input 56 of the transformation system 55.

Figure 5:
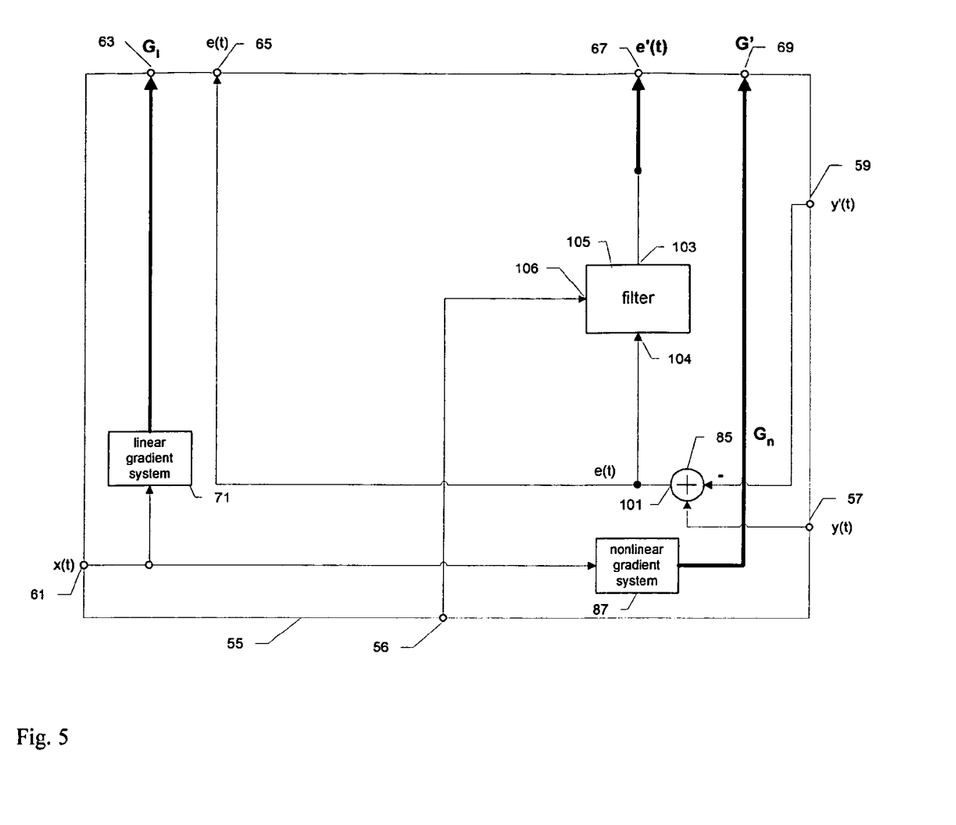
FIG. 5 shows an embodiment of a transformation system using an error filter in accordance with the present invention.

FIG. 5 shows an embodiment of the transformation system 55 which performs filtering of the error signal. The transformation system 55 contains a linear gradient system 71 and a nonlinear gradient system 87, having inputs connected with input 61 and having outputs providing the linear gradient vector $G_l$ and the nonlinear gradient vector $G'=G_n$ to the outputs 63 and 69, respectively—similar to FIG. 3. The transformation system 55 in FIG. 5 also contains an amplifier 85 having inverting and non-inverting inputs connected to inputs 57 and 59, respectively. The total error signal e(t) at output 101 is connected in the same way as in FIG. 3 to output 65. An additional filter 105 having a signal input 104 supplied with the output 101 of the amplifier 85 and having a filter output 103 generating the transformed error signal e'(t) has a linear transfer response according to Eq. (44) which can be changed by the control signal provided via an input 106 from transformation system input 56. The filter 105 may be realized in the frequency domain in a similar way as filter 121.

Figure 6:
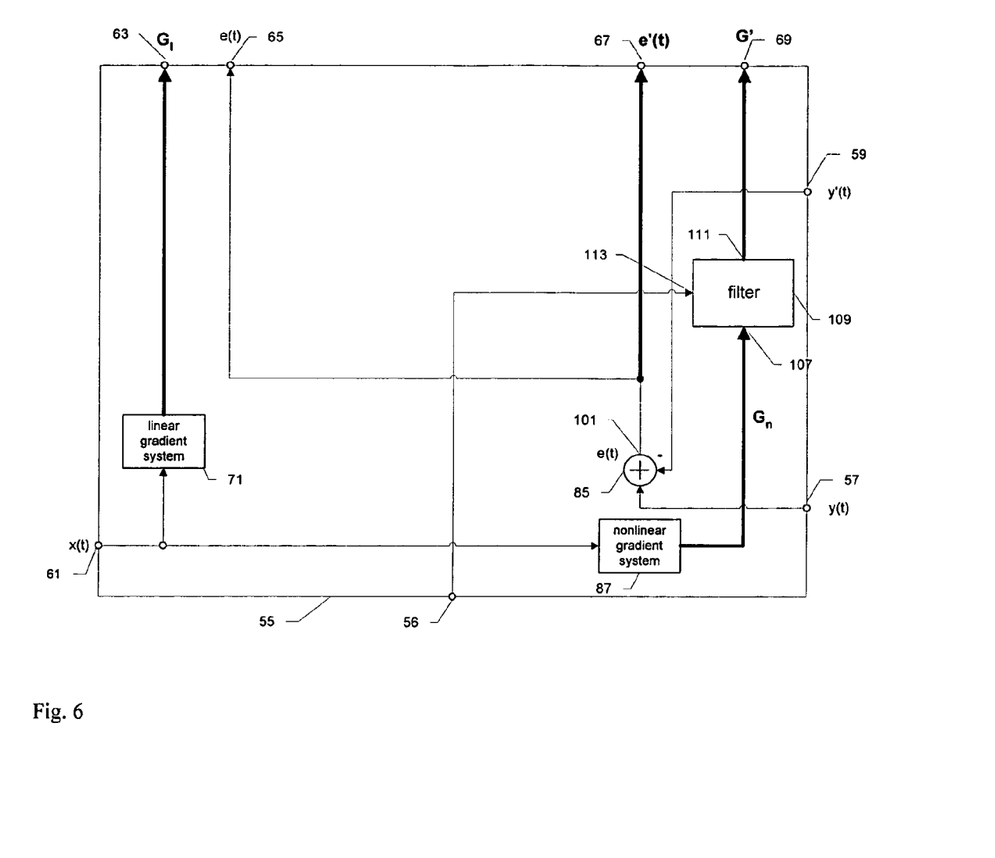
FIG. 6 shows an embodiment of a transformation system using a gradient filter in accordance with the present invention.

FIG. 6 shows an embodiment of the transformation system 55 which performs filtering of the gradient signals. The linear gradient system 71, the nonlinear gradient system 87 and the amplifier 85 are connected in the same way as described in FIG. 5. The total error signal e(t) supplied via output 101 to output 65 is identical with the transformed error signal e'(t) at vector output 67. The main difference to the previous embodiments in FIGS. 3 and 4 is a filter 109 having a vector input 107 provided with nonlinear gradient vector $G_n$ from the output of the nonlinear gradient systems 87. The filter 109 has a transfer function according to Eq. (44) which can be realized by a complex multiplication in the frequency domain similar to the realization of filter 121. However, the filtering of the gradient signals generates a higher computational load than the filtering of the error signal. The transformed gradient vector G' at the vector output of filter 109 is supplied to output 69 of the transformation system 55. The transfer behavior of filter 109 may be varied by a control signal which is provided via transformation system input 56 to an input 113 of filter 109.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An arrangement for optimal and bias-free estimation of linear parameters $P_l$ and nonlinear parameters $P_n$ of a model having a model input and a model output $y'(t) = y'_{lin}(t) + y'_{nlin}(t)$ comprising a linear signal component $y'_{lin}(t)$ determined by said linear parameters $P_l$ and a nonlinear signal component $y'_{nlin}(t)$ determined by said nonlinear parameters $P_{nlin}$, said model describing a transducer having at least one transducer input which is supplied with an electrical, acoustical or arbitrary input signal $x(t)$ and at least one transducer output which generates an electrical, acoustical or arbitrary transducer output signal $y(t) = y_{lin}(t) + y_{nlin}(t)$ comprising a linear signal part $y_{nlin}(t)$ and a nonlinear signal part $y_{nlin}(t)$, characterized in that said arrangement comprises:

a transformation system having a first transformation input connected to receive said input signal $x(t)$, a second transformation input connected to receive said output signal $y(t)$, said transformation system having a first transformation output and a second transformation output, a nonlinear estimation system having a signal input connected to receive said first transformation output and having an nonlinear parameter output providing said nonlinear parameters $P_n$ of the model by minimizing a first cost function $C_n$ which evaluates the nonlinear deviation $e_n(t) = y_{nlin}(t) - y'_{nlin}(t)$ between the nonlinear signal part $y_{nlin}(t)$ of said transducer output signal $y(t)$ and the nonlinear signal component $y'_{nlin}(t)$ in the model output $y'(t)$, and a linear estimation system having an input connected to receive said second transformation output and having an output producing linear parameters $P_l$ of said model by minimizing a second cost function C which evaluates the linear deviation $e_l(t) = y_{lin}(t) - y'_{lin}(t)$ between the linear signal part $y_{lin}(t)$ of said transducer output signal $y(t)$ and the linear signal component $y'_{lin}(t)$ in the model output $y'(t)$.

2. The arrangement of claim 1, wherein said transformation system further comprises:

a third transformation input connected to receive said model output $y'(t)$, an amplifier having an inverting input receiving said model output $y'(t)$ from said third transformation input, having a non-inverting input receiving said output signal $y(t)$ from said second transformation input, and having an total error output generating an error signal $e(t) = y(t) - y'(t)$ which is the difference between said transducer output signal $y(t)$ and model output signal $y'(t)$, said error signal $e(t)$ supplied to said second transformation output, a linear gradient system having an input receiving the input signal $x(t)$ from said first transformation input and having an output generating linear gradient signals $g_{l,j}(t)$ with $j = 1, \ldots, L$ summarized in a vector $G_l(t)$ supplied to said linear estimation system to estimate the linear parameters $P_l$, said linear gradient signal $g_{l,j}(t)$ correlated with the linear signal component $y'_{lin}(t)$ generated by said model, a nonlinear regressor system having an input receiving the input signal $x(t)$ from said first transformation input and having an output generating at least one nonlinear gradient signal $g'_j(t)$ with $j = 1, \ldots, N$ summarized in a vector $G'(t)$ supplied to said nonlinear estimation system to estimate the nonlinear parameters $P_n$, said nonlinear gradient signal $g'_j(t)$ correlated with said nonlinear signal component $y'_{nlin}(t)$ generated by said model, and a decorrelation system having a decorrelation input receiving said error signal $e(t)$ and having at least one decorrelation output providing a decorrelated error signal $e'(t) = e'_n(t) + e'_{res}(t)$ which is the sum of a nonlinear error component $e'_n(t)$ and a residual error component $e'_{res}(t)$ whereas the nonlinear error component $e'_n(t)$ is correlated with said nonlinear deviation $e_n(t)$ and the residual error component $e'_{res}(t)$ is not correlated with said nonlinear gradient signal $g'_j(t)$ in vector $G'(t)$.

3. The arrangement of claim 2, wherein said nonlinear regressor system further comprises:

a nonlinear gradient system having an input receiving said input signal $x(t)$ from said first transformation input and having at least one output generating at least one nonlinear signal $g_j(t)$ with $j = 1, \ldots, N$ summarized in a vector $G_n(t)$, at least one gradient filter having an input receiving said nonlinear signal $g_j(t)$ from the output of said nonlinear gradient system and having an output generating said gradient signals $g'_j(t)$ provided to the output of the nonlinear regressor system.

4. The arrangement of claim 2, wherein said decorrelation system further comprises:

an adder having multiple inputs and an output $e'(t)$ providing the sum of the signals at said multiple inputs to said decorrelation output, a first input of said adder receiving the error signal $e(t)$ from the decorrelation input, a linear synthesis system having an input receiving the input signal $x(t)$ from said first transformation input and having multiple synthesis outputs providing decorrelation signals $b_{j,i}$ which correspond with all possible basic signals $\eta_k$ and $\eta_l$ found in the decomposition of the expectation value $E\{e_j g\} = \Sigma \Pi E\{\eta_k \eta_l\}$ of the product of gradient signal $g_j(t)$ and transformed error signal $e'(t)$, at least one weighting element having a first input connected with one of said synthesis outputs, each weighting element having a control input provided with a decorrelation parameter $c_{j,i}$ which is multiplied with said decorrelation signal $b_{j,i}$ provided at said weighting element's first input and having an output which generates weighted decorrelation signal $c_{j,i} b_{j,i}$ which is supplied to said multiple inputs of said adder, and at least one estimation system having a first input connected with the output of the adder, a second input connected with the first input of the corresponding weighting element, and an output generating optimal values of decorrelation parameter $c_{j,i}$ which make the signal $e'(t)$ at said adder output incoherent to said linear decorrelation signals $b_{i,j}$, said decorrelation parameter $c_{j,i}$ supplied to said control input of said weighting element.

5. The arrangement of claim 3, wherein said arrangement further comprises a band-stop filter having a filter input provided with a signal $u(t)$ with arbitrary temporal and spectral properties and a filter output connected to said transducer input $x(t)$, said band-stop filter arranged to attenuate spectral components at defined frequencies $f_i$ with $i = 1, \ldots, I$ while transmitting the spectral components of the input signals $u(t)$ at all other frequencies $f \neq f_i$ to ensure sufficient excitation of the transducer.

6. The arrangement of claim 5, wherein said decorrelation system is a linear system having a band-pass characteristic between its input and output and arranged to transfer spectral components at defined frequencies $f_i$, with $i = 1, \ldots, I$ which correspond with the blocking frequency of said band-stop filter while attenuating the spectral components of said filter input at all other frequencies f≠$f_i$.

7. The arrangement of claim 5, wherein said gradient filter has a band-pass characteristic and is arranged to transfer spectral components only at defined frequencies $f_i$ with i=1, ..., I corresponding with the blocking frequencies of said band-stop filter while attenuating the spectral components of said filter input at all other frequencies f≠$f_i$.

8. The arrangement of claim 6, further comprising a frequency control system having an output connected to a control input of said band-stop filter, said output also connected to a control input of said decorrelation system, said frequency control device output causing said frequency $f_i(t)$ with i=1, ..., I to vary versus time.

9. The arrangement of claim 7, further comprising a frequency control system having an output connected to a control input of said band-stop filter, said output also connected to a control input of said gradient filter, said frequency control device output causing said frequencies $f_i(t)$ with i=1, ..., I to vary versus time.

10. A method for optimal and bias-free estimation of linear parameters $P_l$ and nonlinear parameters $P_n$ of a model having a model input and a model output y'(t)=y'$_{lin}$(t)+y'$_{nlin}$(t) comprising a linear signal component y'$_{lin}$(t) determined by said linear parameters $P_l$ and a nonlinear signal component y'$_{nlin}$(t) determined by said nonlinear parameters $P_{nlin}$, said model describing a transducer having at least one transducer input which is supplied with an electrical, acoustical or arbitrary input signal x(t) and at least one transducer output which generates an electrical, acoustical or arbitrary transducer output signal y(t)=$Y_{lin}$(t)+$Y_{nlin}$(t) comprising a linear signal part $y_{lin}$(t) and a nonlinear signal part $y_{nlin}$(t), characterized in that said method comprises the steps of:
transforming said input signal x(t), said transducer output signal y(t) and said model output y'(t) into a first transformation output by using a nonlinear system,
transforming said input signal x(t), said output signal y(t) and said model output y'(t) into a second transformation output by using a linear system,
estimating the nonlinear parameters $P_n$ by using said first transformation output and by minimizing a first cost function $C_n$ which summarizes the nonlinear deviation $e_n(t)$=$y_{nlin}$(t)−y'$_{nlin}$(t) between the nonlinear signal part $y_{nlin}$(t) of said transducer output signal y(t) and the nonlinear signal component y'$_{nlin}$(t) of said model output y'(t), and
estimating the linear parameters $P_l$ by using said second transformation output and by minimizing a second cost function C which summarizes the linear deviation $e_l(t)$=$y_{lin}$(t)−y'$_{lin}$(t) between the linear signal part $y_{lin}$(t) of said transducer output signal y(t) and the linear signal component y'$_{lin}$(t) of said model output y'(t).

11. The method of claim 10, further comprising the steps of:
generating the predicted output y'(t) of the model by using a nonlinear system,
generating an error signal e(t)=y(t)−y'(t) which is the difference between said output signal y(t) at the transducer output and the predicted output y'(t) of the model by using an amplifier having an inverting and an non-inverting input, said error signal e(t)=$e_l$+$e_n$+$e_r$ comprising said linear deviation $e_l(t)$, said nonlinear deviation $e_n(t)$ and a residual component $e_r(t)$,
generating at least one nonlinear gradient signal g'$_j$(t) with j=1, ..., N summarized in a vector G'(t) in said first transformation output and supplied to a nonlinear estimation system to estimate the nonlinear parameters $P_n$ such that said nonlinear gradient signals g'$_j$(t) are correlated with the nonlinear signal part y'$_{nlin}$(t),
generating at least one linear gradient signal $g_{l,j}$(t) with j=1, ..., L summarized in a vector $G_l$(t) in said second transformation output and supplied to a linear estimation system to estimate the linear parameters $P_l$ such that said gradient signals $g_{l,j}$(t) are correlated with the linear signal part y'$_{lin}$(t),
generating a decorrelated error signal e'(t)=e'$_n$(t)+e'$_{res}$(t) which is the sum of a nonlinear error component e'$_n$(t) and a residual error component e'$_{res}$(t) from said error signal e(t), such that said nonlinear error component e'$_n$(t) is correlated with said nonlinear deviation $e_n(t)$ and said residual error component e'$_{res}$(t) is not correlated with any nonlinear gradient signal g'$_j$(t) in vector G'(t).

12. The method of claim 11, further comprising the steps of:
generating for each nonlinear parameter $P_{n,j}$ with j=1, ..., N a decorrelation signal $d_j$=$C_j B_j$, and
generating a decorrelated error signal $e_j(t)$=e(t)+$d_j$ which is part of said first transformation output by using an adding device which adds said decorrelation signal $d_j$=$C_j B_j$ to the error signal e(t),
where $C_j$ is a decorrelation parameter vector and $B_j$ is a compensation vector.

13. The method of claim 12, further comprising the steps of:
linear filtering the input signal x(t) to generate for each nonlinear parameter $P_{n,j}$ with j=1, ..., N a set of decorrelation signals $b_{j,k}$ with k=1, ..., K summarized in a compensation vector $B_j$,
scaling the amplitude of each decorrelation signal $b_{j,k}$ with k=1, ..., K by a decorrelation parameter $c_{j,k}$ summarized in a decorrelation parameter vector $C_j$, and
summing up all scaled decorrelation signals $c_{j,k} b_{j,k}$ to generate said decorrelation signal $d_j$=$C_j B_j$.

14. The method of claim 13, further comprising the step of:
selecting the correlation signals $b_{j,k}$=$η_k$ from all basic signals $η_k$ and $η_l$ found in the decomposition of the expectation value E{e'$_j$g$_j$}=ΣΠE{$η_k η_l$} of the product of transformed error signal e'(t) and gradient signal $g_j$(t), and
generating said decorrelation parameter vector $C_j$ by using said compensation vector $B_j$.

15. The method of claim 11, further comprising the step of:
linear filtering an external input signal u(t) by using a band-stop filter with a transfer function $H_p(f)$ to attenuate the spectral component in said input signal x(t) at defined frequencies $f_i$ with i=1, ..., I while transmitting the spectral components of the input signals u(t) at all other frequencies f≠$f_i$ to ensure sufficient excitation of the transducer.

16. The method of claim 15, further comprising the step of:
linear band-pass filtering of said output signal y(t) or said error signal e(t) with a transfer function $H_a(f)$ to generate said decorrelated error signal e'(t), said transfer function $H_a(f)$ transferring spectral components at defined frequencies f=$f_i$ with i=1, ..., I which have been attenuated by the transfer function $H_p(f)$ of the band-stop filter and attenuating the spectral components at all other frequencies f≠$f_i$ which have been transferred by the band-stop filter.

17. The method of claim 15, further comprising the steps of:
generating a nonlinear gradient signal $g_j(t)$ for each nonlinear parameter $p_{n,j}$ with j=1, ..., N from the input signal x(t) by using a nonlinear system which corresponds with the nonlinear signal component $y'_{nlin}(t) = P_{sn}G_n$ with $G_n^T(t) = [g_1(t) \ldots g_N(t)]$ generated in said model, where Psn is a scalar product of a parameter vector, and linear band-pass filtering each gradient signal $g_j(t)$ with a transfer function $H_a(f)$ to generate said gradient signal $g_j'(t)$ in said first transformation output, said transfer function $H_a(f)$ transferring spectral components at defined frequencies $f=f_i$ with $i=1, \ldots, I$ which has been attenuated by the transfer function $H_p(f)$ of said band-stop filter and attenuating the spectral components at all other frequencies $f \neq f_i$ which has been transferred by said band-stop filter.

18. The method of claim 15, further comprising the step of:
varying the frequency $f_i$ with $i=1, \ldots, I$ of the transfer response $H_p(f)$ in said band-stop filter during parameter estimation.

\* \* \* \* \*

UNITED STATES PATENT AND TRADEMARK OFFICE
CERTIFICATE OF CORRECTION

PATENT NO. : 8,078,433 B2
APPLICATION NO. : 12/009879
DATED : December 13, 2011
INVENTOR(S) : Wolfgang Klippel It is certified that error appears in the above-identified patent and that said Letters Patent is hereby corrected as shown below:

In the claims, Claim 1, col. 12, line 17, should read "Y lin(t)" and not "Y nlin(t)"
In the claims, Claim 2, col. 12, line 49, should read "a" and not "an"
In the claims, Claim 17, col. 15, line 9, should read "have" and not "has"

Signed and Sealed this
Twenty-first Day of February, 2012

David J. Kappos
*Director of the United States Patent and Trademark Office*